United States Patent [19]

Dubois et al.

[11] Patent Number: 4,890,381
[45] Date of Patent: Jan. 2, 1990

[54] CONTACTING DEVICE AND METHOD FOR CONNECTING A CONDUCTIVE FOIL

[75] Inventors: Dieter Dubois, Augsburg, Fed. Rep. of Germany; Helge-Detlev Breite, Eupen, Belgium

[73] Assignee: Siemens Aktiengesellschaft, Berlin and Munich, Fed. Rep. of Germany

[21] Appl. No.: 173,581

[22] Filed: Mar. 25, 1988

[30] Foreign Application Priority Data

Mar. 31, 1987 [DE] Fed. Rep. of Germany ....... 3710593

[51] Int. Cl.⁴ .................................................. H05K 3/30
[52] U.S. Cl. ........................................ 29/832; 29/842; 439/493; 439/495
[58] Field of Search ................... 29/832, 842; 439/492, 439/493, 495, 496

[56] References Cited

U.S. PATENT DOCUMENTS

| | | | |
|---|---|---|---|
| 3,893,745 | 7/1975 | Codrino | 439/495 |
| 3,941,448 | 3/1976 | Evans . | |
| 4,519,133 | 5/1985 | Pansanel | 439/495 |

FOREIGN PATENT DOCUMENTS 0194758  9/1986  European Pat. Off. .

*Primary Examiner*—Timothy V. Eley
*Attorney, Agent, or Firm*—Hill, Van Santen, Steadman & Simpson

[57] ABSTRACT

A strip-shaped longitudinal rib forces the clip projection of a conductive foil provided for connection out of the plane of its carrying surface. Given contact pressure of the contact springs of a spring strip the clip projection molds against the strip-shaped longitudinal rib and is clamped between the latter and the spring strip.

7 Claims, 1 Drawing Sheet

CONTACTING DEVICE AND METHOD FOR CONNECTING A CONDUCTIVE FOIL

BACKGROUND OF THE INVENTION

1. Field of the Invention

The invention is directed to a contacting device for the electrical connection of a conductive foil lying against a carrying surface to a spring strip and to a method for automatic contacting upon employment of this contacting device.

2. Description of the Prior Art

It is very frequently not only the geometry of an electrical apparatus that makes it necessary to distribute the component parts needed for the function of the apparatus onto a plurality of assemblies. The advantages of modular formatting also provide inducements to realize a function complex that essentially belongs together on an assembly that can be easily physically separated from the rest of the circuit and, thus, can be quickly replaced.

To this end, every electrical line leaving the assembly must be interruptable via a contact device and must be reconnectable. In general, multiple plug connectors are used for this purpose, these being composed of a plug strip and of a jack strip each comprising a plurality of contact elements. A total of two plug and two jack strips are required in order to electrically connect two assemblies to one another, for example, via a cable, with these multiple plug connectors.

The not inconsiderable cost factor of such a plugged connection provided the impetus to the saving measure to use the printed circuit board of the assembly as a plug connector strip. To that end, all the lines leaving the assembly are conducted to an edge of the printed circuit board in the form of strip-shaped interconnects proceeding parallel to one another at the surface of the printed circuit board. The jack strip is replaced by a spring strip that comprises contact springs allocated to the strip-shaped interconnects and that is plugged onto the edge of the printed circuit board.

A further measure for reducing costs is comprised in allocating the cable to one of the assemblies and securing it thereto directly, i.e., without a releasable plugged connection. However, a higher production-oriented outlay is required for the direct connection of a cable to an assembly, this frequently outweighing the costs of the saved plugged connection.

Direct connection represents an ideal solution only now that conductive foils have been developed, these enabling a flexible conductor guidance similar to a cable. The function of a printed circuit board and that of a cable can be united in a single conductive foil. Thus, for example, one sub-area of the conductive foil meets the function of a printed circuit board and another sub-area, usually recognizable as a clip projection, meets the function of a cable.

A releasable electrical connection between the conductive foil and a flat module can now again be produced with the assistance of an electrical connector composed of a plug and jack strip or, as set forth above, can be produced by interconnects guided to an edge of the clip projection and having the appertaining spring strip.

A critical problem arises, however, given utilization of the second, more cost-beneficial embodiment in production equipment that provides an automatic assembly of the apparatus. Due to the flexible behavior of the clip projection, namely, a non-positive plug-on of the spring strip could previously only be manually effected.

SUMMARY OF THE INVENTION

It is therefore the object of the invention to improve such a releasable electrical connection with the lowest possible outlay such that an automatic contacting is possible.

This object is inventively achieved wherein at least one side of a clip projection connected to the conductive foil has a plurality of electrical contact surfaces to which individual contact springs of the spring strip are respectively allocated by providing a strip-shaped longitudinal rib forcing the clip projection out of the plane of the carrying surface, the clip projection molding against the strip-shaped longitudinal rib given contact pressure of the contact springs.

In an alternative embodiment, the carrying surface and the strip-shaped longitudinal rib are fixed by a common frame and are spatially arranged relative to one another such that a gap-shaped interspace for the introduction of the clip projection remains between the carrying surface and the strip-shaped longitudinal rib.

In either embodiment, the spring strip can be plugged onto the strip-shaped longitudinal rib with a positive lock. Further, the strip-shaped longitudinal rib can be slanted or beveled along at least one longitudinal edge to be mortised or pressed against the clip projection.

The present invention also contemplates a method for automatic contacting (as opposed to manual assembly) upon employment of a contacting device as described above. First the clip projection of the conductive foil is applied against the strip-shaped longitudinal rib and the conductive foil is then secured on the carrying surface. Subsequently, the clip projection is clamped between the strip-shaped longitudinal rib and the contact springs of the spring strip.

If a contacting device such as that of the alternative embodiment is employed, the clip projection is placed against the strip-shaped longitudinal rib through the gap-shaped interspace and the spring strip is plugged onto the strip shaped longitudinal rib proceeding from the foil-free side of the carrying surface.

BRIEF DESCRIPTION OF THE DRAWINGS

An exemplary embodiment shall be set forth in greater detail with reference to the drawing. Thereby shown are.

DESCRIPTION OF THE PREFERRED EMBODIMENTS

Figure 1:
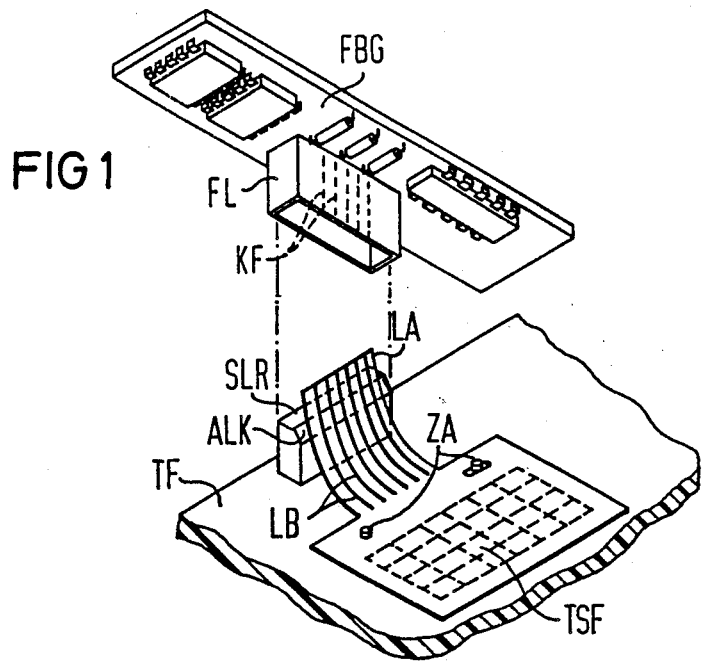
FIG. 1 is a perspective view of an inventive contacting device for a keyboard switch foil secured to a carrying surface and a flat module comprising a spring strip.

FIG. 1 shows a carrying surface TF comprising a strip-shaped longitudinal rib SLR against which a rectangular clip projection LA of a keyboard switch foil TSF secured to the carrying surface TF presses resiliently. A flat module FBG comprising a spring strip FL is also shown, its allocation to the strip-shaped longitudinal rib SLR of the carrying surface TF being indicated.

The keyboard switch film TSF lies against the carrying surface TF serving as a bottom surface. Two pegs ZA projecting from the carrying surface TF engage into corresponding recesses of the keyboard switch foil TSF and fix the latter on the carrying surface TF. A plurality of parallel, strip-shaped interconnects LB are conducted on the clip projection LA of the keyboard switch foil TSF at that side facing away from the carrying surface TF and end in a right angle at the face edge of the rectangular clip projection LA.

The strip-shaped longitudinal rib SLR is located on that side of the carrying surface TF carrying the keyboard switch foil TSF and is secured to the carrying surface TF perpendicular to the plane of the carrying surface such that the clip projection LA can be displaced out of the plane of the carrying surface. To that end, the strip-shaped longitudinal rib SLR proceeds parallel to the face edge of the rectangular clip projection LA and has an advantageously slanted longitudinal edge ALK mortised against that side of the clip projection LA directed toward the carrying surface TF.

The spring strip FL provided for the electrical contacting of the interconnects LB conducted out on the clip projection LA has the form of an oblong trough in whose inside the strip-shaped longitudinal rib SLR can be introduced in positive-locking fashion. A plurality of contact springs KF directed into the interior are contained in a longitudinal wall of the spring strip FL, these contact springs KF being provided for the electrical contacting of the interconnects LB of the clip projection LA.

When plugging the spring clip FL onto the strip-shaped longitudinal rib SLR and onto the clip projection LA resting thereagainst, the slanted longitudinal edge ALK forms an approach ramp for the contact springs KF that can thereby be displaced into the longitudinal wall of the spring strip FL with little force exertion, so that the spring strip FL is easier to plug on. The contact springs KF are forced ever farther back by the face edge of the clip projection LA and press against the interconnects LB of the clip projection LA that thereby molds itself against the strip-shaped longitudinal rib SLR and is clamped between the latter and the contact springs KF of the spring strip FL.

Figure 2:
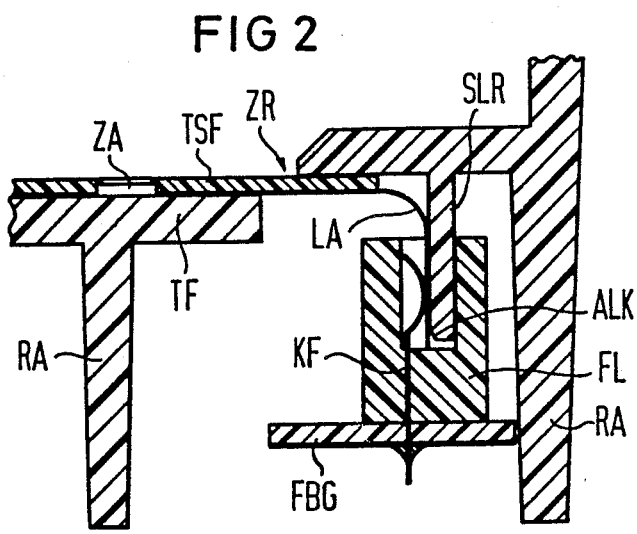
FIG. 2 is a cross-section through the contacting device of the invention according to FIG. 1 comprising a spring strip plugged on proceeding from the foil-free side of the carrying surface.

In a cross-section, FIG. 2 shows the carrying surface TF and the strip-shaped longitudinal rib SLR each of which is attached to one of two lateral parts lying opposite one another in a shared frame RA, spaced from one another by a gap-like interspace ZR.

The keyboard switch foil TSF lies against the carrying surface TF and is fixed by the peg ZA. Since, differing from that shown in FIG. 1, the strip-shaped longitudinal rib SLR IS directed in the direction of the foil-free side of the carrying surface TF, is consequently displaces the clip projection out of the plane of the carrying surface TF in this direction as well. To that end, the strip-shaped longitudinal rib SLR is distanced such from the edge of the carrying surface TF that the gap-shaped interspace ZR is formed, the clip projection LA proceeding therethrough to the strip-shaped longitudinal rib SLR.

A contacting of the keyboard switch foil TSF with the flat module FBG can ensue fully automatically in three steps.

In a first step, the keyboard switch foil TSF, potentially at an acute angle relative to the carrying surface TF, has its clip projection LA placed through the gap-shaped interspace ZR against the strip-shaped longitudinal rib SLR. In the second step, the keyboard switch foil TSF is lowered onto the carrying surface TF, so that the pegs ZA engage into the recesses. In the last step, the flat module FBG is guided proceeding from the foil-free side of the carrying surface TF to the strip-shaped longitudinal rib SLR with a direction of movement proceeding perpendicular to the carrying surface TF and the spring strip FL is plugged onto the strip-shaped longitudinal rib SLR and onto the clip projection LA resting thereagainst.

As is apparent from the foregoing specification, the invention is susceptible of being embodied with various alterations and modifications which may differ particularly from those that have been described in the preceding specification and description. It should be understood that we wish to embody within the scope of the patent warranted hereon all such modifications as reasonably and properly come within the scope of our contribution to the art.

We claim as our invention:

1. A method for automatic contacting of a conductive foil lying against a carrying surface to a spring strip, wherein at least one side of a clip projection connected to the conductive foil comprises a plurality of electrical contact surface to which individual contact springs of the spring strip are respectively allocated; comprising the steps wherein the clip projection of the conductive foil is first applied against the strip-shaped longitudinal rib, which is arranged at a fixed position relative to the carrying surface and which is forcing the clip projection out of the plane of the carrying surface, the conductive foil is then secured on the carrying surface in that, subsequently, the clip projection is clamped between the strip-shaped longitudinal rib and the contact springs of the spring strip, whereby the clip projection engages against said strip-shaped longitudinal rib upon contact pressure of the contact springs.

2. A method for automatic contact according to claim 1, wherein the carrying surface and the strip-shaped longitudinal rib are fixed by a common frame and are spatially arranged relative to one another such that a gap-shaped interspace for the introduction of the clip projection remains between the carrying surface and the strip-shaped longitudinal rib, the clip projection is placed against the strip-shaped longitudinal rib through the gap-shaped interspace and the spring strip is plugged onto the strip-shaped longitudinal rib proceeding from the foil-free side of the carrying surface.

3. A contact device for the electrical connection of a conductive foil lying against a carrying surface to a spring strip, wherein at least one side of a clip projection connected to the conductive foil comprises a plurality of electrical contact surfaces to which individual contact springs of the spring strip are respectively allocated, comprising a strip-shaped longitudial rib, arranged at a fixed position relative to the carrying surface forcing the clip projection out of the plane of the carrying surface, the clip projection engaging against said strip-shaped longitudinal rib upon contact pressure of the contact springs.

4. A contacting device for the electrical connection of a conductive foil lying against a carrying surface to a spring strip, wherein at least one side of a clip projection connected to the conductive foil comprises a plurality of electrical contact surfaces to which individual contact springs of the spring strip are respectively allocated, comprising a strip-shaped longitudinal rib forcing the clip projection out of the plane of the carrying surface, the clip projection engaging against said strip-shaped longitudinal rib upon contact pressure of the contact springs, said carrying surface in the strip-shaped longitudinal rib are fixed by a common frame and are spatially arranged relative to another such that a gap-shaped interspace for the introduction of clip projection remains between the carrying surface and the strip-shaped longitudinal rib.

5. A contact device according to claim 3, including a spring strip that can be plugged onto the strip-shaped longitudinal rib with positive lock.

6. A contacting device according to claim 5, wherein the strip-shaped longitudinal rib is slanted at at least one longitudinal edge mortised against the clip projection.

7. A contacting device according to claim 6, wherein the spring strip is secured to a flat module.

* * * * *